United States Patent
Quaglietta

(10) Patent No.: US 9,632,522 B2
(45) Date of Patent: Apr. 25, 2017

(54) CURRENT MIRROR BIAS CIRCUIT WITH VOLTAGE ADJUSTMENT

(71) Applicant: SKYWORKS SOLUTIONS, INC., Woburn, MA (US)

(72) Inventor: Tony Quaglietta, Methuen, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/095,630

(22) Filed: Apr. 11, 2016

(65) Prior Publication Data

US 2017/0023968 A1    Jan. 26, 2017

Related U.S. Application Data

(60) Provisional application No. 62/148,075, filed on Apr. 15, 2015.

(51) Int. Cl.
| | | |
|---|---|---|
| *H04B 1/04* | (2006.01) |
| *H03F 3/21* | (2006.01) |
| *H03F 3/20* | (2006.01) |
| *G05F 3/26* | (2006.01) |
| *H04L 25/06* | (2006.01) |
| *H04B 1/40* | (2015.01) |

(52) U.S. Cl.
CPC .............. *G05F 3/267* (2013.01); *H04B 1/40* (2013.01); *H04L 25/06* (2013.01); *H04M 2201/02* (2013.01); *H04M 2201/04* (2013.01)

(58) Field of Classification Search
CPC ........ H03F 1/0294; H03F 3/602; H03F 3/211; H03F 2203/21163; H03F 3/60; H03F 3/20; H03F 1/02; H03F 3/21; H04B 1/04
See application file for complete search history.

(56) References Cited

U.S. PATENT DOCUMENTS

| | | | | |
|---|---|---|---|---|
| 6,265,943 B1 * | 7/2001 | Dening | ................. | H03F 1/0261 330/285 |
| 6,624,702 B1 * | 9/2003 | Dening | ................. | H03F 1/0233 330/285 |
| 7,443,246 B2 * | 10/2008 | Andrys | ................. | H03F 1/0261 330/285 |
| 8,289,084 B2 * | 10/2012 | Morimoto | ............ | H03F 1/0216 330/296 |

(Continued)

*Primary Examiner* — Pablo Tran
(74) *Attorney, Agent, or Firm* — Chang & Hale LLP

(57) ABSTRACT

Current mirror bias circuit with voltage adjustment. A biasing system can include an input configured to receive an input current and an output configured to provide an output current. The biasing system can include a first transistor having a first base coupled to the input and a first collector coupled to a supply voltage. The biasing system can further include a second transistor having a second base coupled to the output, a second collector coupled to the input, and a second emitter coupled to a ground voltage. The biasing system can include a voltage adjustment component having a voltage adjustment input coupled to a first emitter of the first transistor and a voltage adjustment output coupled to the output. The voltage adjustment component can be configured to reduce a voltage from the voltage adjustment input to the voltage adjustment output substantially independent of a magnitude of a current through the voltage adjustment component.

20 Claims, 7 Drawing Sheets

(56) References Cited

U.S. PATENT DOCUMENTS

| | | | | |
|---|---|---|---|---|
| 8,471,628 B2* | 6/2013 | Ryat | ............ | H03F 1/305 |
| | | | | 330/296 |
| 8,692,619 B2* | 4/2014 | Wakita | ............ | H03F 1/0261 |
| | | | | 330/289 |
| 8,824,983 B2* | 9/2014 | Doherty | ............ | H03G 3/3047 |
| | | | | 455/127.1 |

* cited by examiner

CURRENT MIRROR BIAS CIRCUIT WITH VOLTAGE ADJUSTMENT

CROSS-REFERENCE TO RELATED APPLICATION(S)

This application claims priority to U.S. Provisional Application No. 62/148,075 filed Apr. 15, 2015, entitled CURRENT MIRROR BIAS CIRCUIT WITH VOLTAGE ADJUSTMENT, the disclosure of which is hereby expressly incorporated by reference herein in its entirety.

BACKGROUND

Field

The present disclosure generally relates to bias circuits.

Description of the Related Art

In a mirror type bias circuit, the output current (or voltage) generally reflects an input current (or voltage), either being equal to the input current (or voltage) or proportional to it. However, mirror type bias circuits can accrue error as a function of increased power of the signal being amplified. In particular, the output current (or voltage) may not accurately reflect the input current (or voltage) under various conditions. This may occur because the mirror device of the mirror type bias circuit may not have the same power dissipation level as the radio-frequency (RF) device being biased at quiescent or peak power levels.

SUMMARY

In accordance with some implementations, the present disclosure relates to a biasing system. The biasing system includes an input configured to receive an input current and an output configured to provide an output current. The biasing system include a first transistor having a first base coupled to the input and a first collector coupled to a supply voltage. The biasing system further includes a second transistor having a second base coupled to the output, a second collector coupled to the input, and a second emitter coupled to a ground voltage. The biasing system includes a voltage adjustment component having a voltage adjustment input coupled to a first emitter of the first transistor and a voltage adjustment output coupled to the output. The voltage adjustment component is configured to reduce a voltage from the voltage adjustment input to the voltage adjustment output substantially independent of a magnitude of a current through the voltage adjustment component.

In some embodiments, the second base can be coupled, via a capacitor, to the input.

In some embodiments, the biasing system can further include a current source coupled to the input. In some embodiments, the current source can include a resistor coupled to a reference voltage.

In some embodiments, the biasing system can include a third transistor having a third base coupled to the output, a third emitter coupled to the ground voltage, and a third collector coupled, via an inductor, to the supply voltage. In some embodiments, the third base can be coupled to a radio-frequency (RF) input configured to receive an input RF signal and the third collector can be coupled to an RF output configured to provide an output RF signal. The output RF signal can be an amplified version of the input RF signal. In some embodiments, the output current can bias the third transistor. In some embodiments, the first transistor can be an emitter follower device, the second transistor can be a mirror device, and the third transistor can be an RF device.

In some embodiments, the voltage adjustment component can include a diode. In some embodiments, the voltage adjustment component can include a voltage adjustment transistor having a voltage adjustment transistor base coupled to a voltage adjustment transistor collector. In some embodiments, the voltage adjustment component can include a plurality of voltage adjustment transistors in a Darlington configuration. In some embodiments, the voltage adjustment component can include a plurality of voltage adjustment elements connected in series.

In some embodiments, the voltage adjustment component can reduce the voltage by approximately 3.5 volts. In some embodiments, the voltage adjustment component can reduce a first collector-emitter voltage between the first collector and the first emitter. In some embodiments, the voltage adjustment component can increase a second collector-emitter voltage between the second collector and the second emitter.

In some embodiments, the voltage adjustment component can equalize the voltage such that a second collector-emitter voltage between the second collector and the second emitter is approximately equal to a third collector-emitter voltage between the third collector and a third emitter.

In some implementations, the present disclosure relates to radio-frequency (RF) module including a packaging configured to receive a plurality of components and a biasing system implemented on the packaging substrate. The biasing system has an input configured to receive an input current and an output configured to provide an output current. The biasing system includes a first transistor having a first base coupled to the input and a first collector coupled to a supply voltage. The biasing system further includes a second transistor having a second base coupled to the output, a second collector coupled to the input, and a second emitter coupled to a ground voltage. The biasing system includes a voltage adjustment component having a voltage adjustment input coupled to a first emitter of the first transistor and a voltage adjustment output coupled to the output. The voltage adjustment component is configured to reduce a voltage from the voltage adjustment input to the voltage adjustment output substantially independent of a magnitude of a current through the voltage adjustment component.

In some embodiments, the RF module can be a front-end module (FEM).

In some embodiments, the RF module can include an RF system. The RF system can include a third transistor having a third base coupled to the output, a third emitter coupled to the ground voltage, and a third collector coupled, via an inductor, to the supply voltage. In some embodiments, the third base is coupled to a radio-frequency (RF) input configured to receive an input RF signal and the third collector is coupled to an RF output configured to provide an output RF signal, the output RF signal being an amplified version of the input RF signal.

In some implementations, the present disclosure relates to a wireless device. The wireless device includes a transceiver configured to generate a radio-frequency (RF) signal. The wireless device includes a front-end module (FEM) in communication with the transceiver. The FEM includes a packaging substrate configured to receive a plurality of components and a biasing system implemented on the packaging substrate. The biasing system has an input configured to receive an input current and an output configured to provide an output current. The biasing system includes a first transistor having a first base coupled to the input and a first collector coupled to a supply voltage. The biasing system includes a second transistor having a second base coupled to the output, a second collector coupled to the input, and a second emitter coupled to a ground voltage. The biasing system includes a voltage adjustment component having a voltage adjustment input coupled to a first emitter of the first transistor and a voltage adjustment output coupled to the output. The voltage adjustment component is configured to reduce a voltage from the voltage adjustment input to the voltage adjustment output substantially independent of a magnitude of a current through the voltage adjustment component. The wireless device further includes an antenna in communication with the FEM. The antenna is configured to transmit the RF signal.

In some embodiments, the FEM can further include an RF system implemented on the packaging substrate. The RF system can include a third transistor having a third base coupled to the output, a third emitter coupled to the ground voltage, and a third collector coupled, via an inductor, to the supply voltage. In some embodiments, the third base can be coupled to a radio-frequency (RF) input configured to receive the RF signal and the third collector can be coupled to an RF output configured to provide the RF signal to the antenna.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In a mirror type bias circuit, the output current (or voltage) generally reflects an input current (or voltage), either being equal to the input current (or voltage) or proportional to it, with the design objective of the mirror output being substantially independent of impedance loading. The input value being copied may be a constant or a varying input value. However, mirror type bias circuits can accrue error as a function of increased power of the signal being amplified, such as a radio-frequency (RF) signal. In particular, the output current (or voltage) may not accurately reflect the input current (or voltage) under various conditions. This may occur because the mirror device of the mirror type bias circuit may not have the same power dissipation level as the radio-frequency (RF) device being biased at quiescent or peak power levels.

Disclosed herein are various examples of circuits, devices and methods that can be configured to, among others, address the foregoing challenges associated with mirror type bias circuits. In some implementations as described herein, a mirror type bias circuit includes a voltage adjustment (VA) component that reduces a voltage across the VA component.

For example, a diode string may be coupled to the emitter of an emitter-follower device of the mirror type bias circuit, decreasing the collector-emitter voltage (Vce) across the emitter-follower device, but raising the voltage at the base of the emitter-follower device and, thus, the Vce of the mirror device. The number of diodes may be chosen to equalize the Vce across the mirror device and the RF device. Such a configuration may improve tracking of the mirror device at least when the RF device is used in a quiescent or in linear modes of operation.

Figure 1:
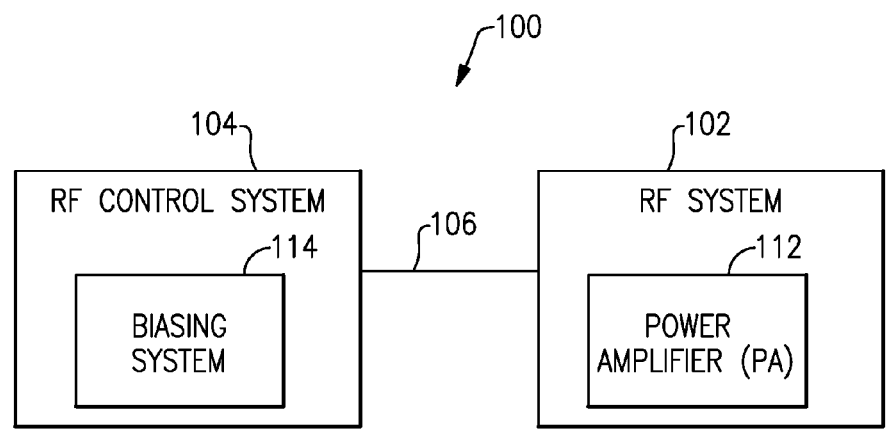
FIG. 1 shows an RF system operating configuration that includes an RF system being controlled by an RF control system.

FIG. 1 shows an RF system operating configuration 100 that includes an RF system 102 being controlled (via line 106) by an RF control system 104. The RF control system 104 includes a biasing system 114 that may include a current mirror bias circuit. The biasing system 114 may include a mirror type bias circuit or any other kind of bias circuit. The RF system 102 includes a power amplifier (PA) 112 that amplifies an input RF signal to produce an output RF signal.

Figure 2:
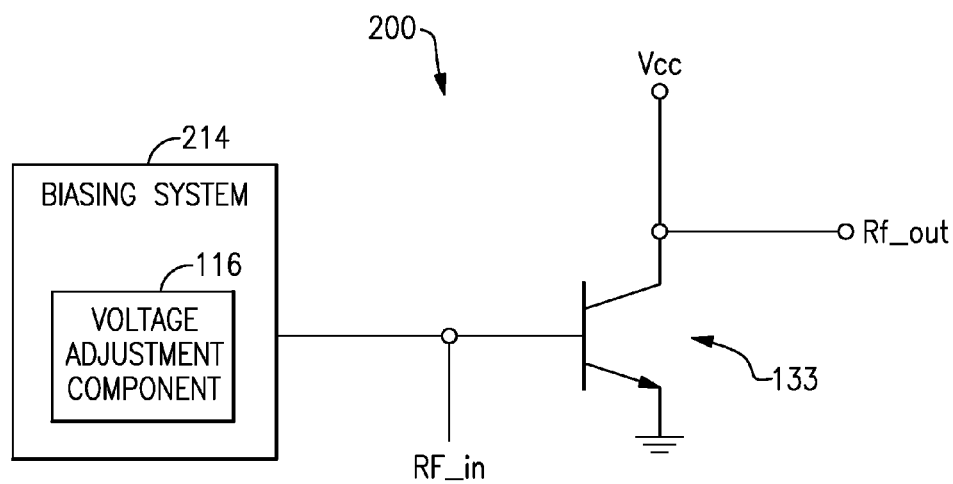
FIG. 2 shows a more specific example of an RF system operating configuration in an example context of a bipolar junction transistor (BJT) based PA.

FIG. 2 shows a more specific example of such an operating configuration 200 in an example context of a bipolar junction transistor (BJT) based PA. Although described herein in such a context, it will be understood that one or more features of the present disclosure can also be implemented in PAs based on other types of transistors. Similarly, although the transistors described herein are described as having a base, collector, and emitter, it is to be appreciated that the use of these terms does not exclude transistors in which gate, source, and drain terminology is typically employed, such as field effect transistors (FETs).

In FIG. 2, a radio-frequency (RF) signal being amplified can be provided to the base of the transistor 133 from an input port (RFin). Such an input signal can be passed through an input path that can include, for example, an input matching network. The amplified signal can then be output through the collector of the transistor 133, and then through an output port (RFout). The output signal can, similarly, be passed through an output path that can include, for example an output matching network. In the example of FIG. 2, a supply voltage (Vcc) is provided to the collector of the transistor 133. The supply voltage may be provided, for example, by a battery.

As further shown in FIG. 2, a biasing system 214 including a voltage adjustment component 116 is coupled to the base of the transistor 133 and may provide a biasing voltage or biasing current to bias the transistor 133. Various examples of the biasing system 214 are described herein in greater detail.

Figure 3:
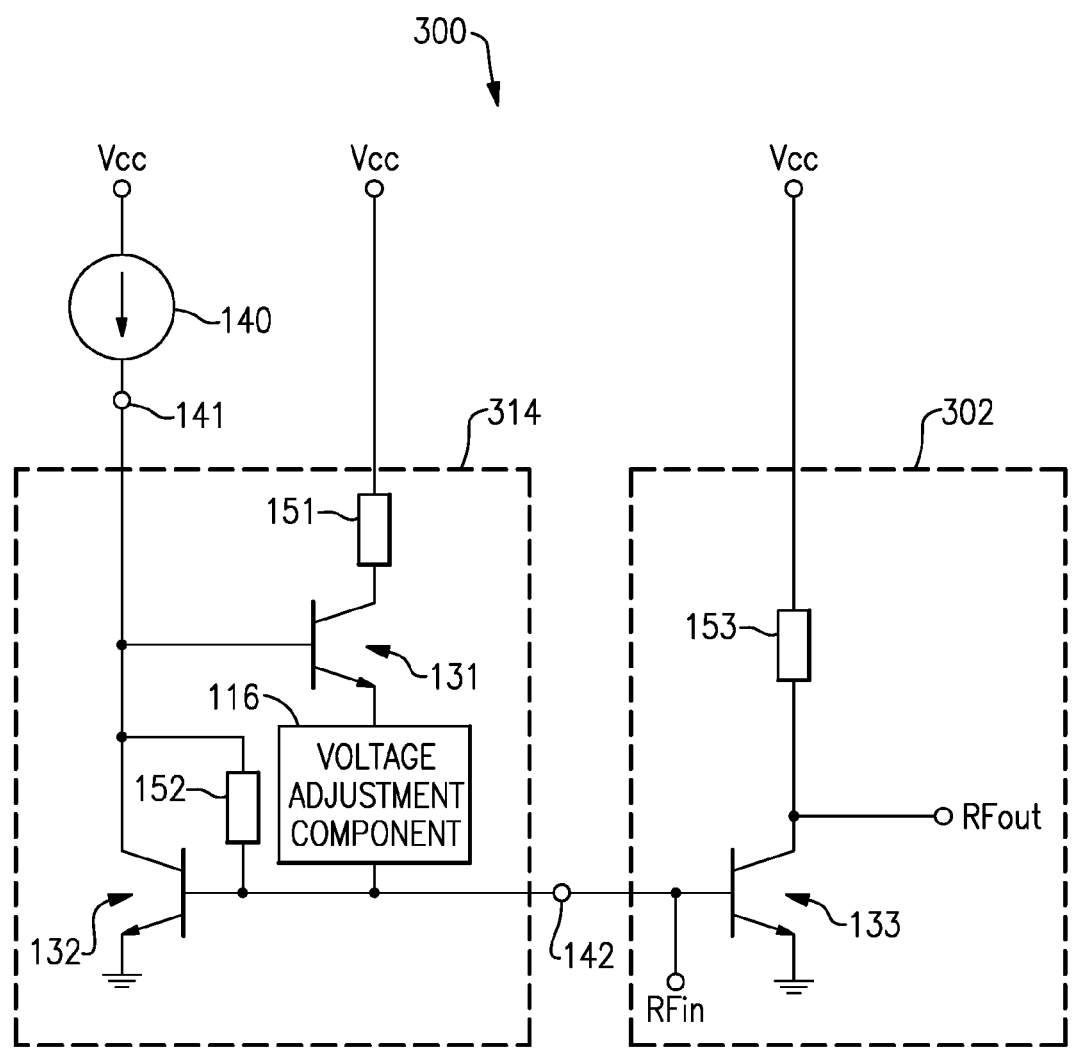
FIG. 3 shows an example of an amplification system including a bias circuit and a power amplifier.

FIG. 3 shows an example of an amplification system 300 including a bias circuit 314 and a power amplifier 302. The bias circuit 314 can provide a bias signal to the power amplifier 302. In some embodiments, the power amplifier 302 can be one of a plurality of amplification stages of the amplification system, including but not limited to a driver stage or an output stage.

The bias circuit 314 may be configured as a current mirror bias circuit. The bias circuit 314 includes an input 141 that receives an input current and an output 142 that provides an output current. The output current may reflect the input current, being equal to the input current or proportional to it, substantially independent of the load of the power amplifier 302. The input current may be generated by current source 140 powered by a supply voltage (Vcc). As noted above, the supply voltage may be provided by a battery and may be, for example, approximately 5.0 volts (V). The current source 140 may generate a reference voltage, using the supply voltage, which is applied to a reference resistor coupled to the reference voltage to generate the input current. The output current may bias a transistor 133 of the power amplifier 302.

The bias circuit 314 includes a first transistor 131. The first transistor 131 may be configured as an emitter-follower device. The first transistor 131 has a first base that is coupled to the input 141 of the bias circuit 314, a first collector that is coupled (via a first impedance 151 that may include, for example, a resistor) to the supply voltage, and a first emitter that is coupled (via a voltage adjustment component 116 described in detail below) to the output 142 of the bias circuit 314.

The bias circuit 314 further includes a second transistor 132. The second transistor 132 may be configured as a mirror device. The second transistor 132 has a second base that is coupled to the output 142 of the bias circuit 314, a second collector that is coupled to the input 141 of the bias circuit 314, and a second emitter that is coupled to a ground voltage. The second base and the second collector of the second transistor 132 may be coupled by a second impedance 152 that may include, for example, a capacitor. Thus, the second base of the second transistor 132 may be coupled, via the second impedance, to the input 141 of the bias circuit 314.

The power amplifier 302 includes a third transistor 133. The third transistor 133 may be configured as an RF device. The third transistor 133 has a third base that is coupled to the output 142 of the bias circuit 314, a third collector that is coupled (via a third impedance 153 that may include, for example, an inductor) to the supply voltage, and a third emitter that is coupled to the ground voltage. As described above with respect to FIG. 2, a radio-frequency (RF) signal being amplified can be provided to the base of the third transistor 133 from an input port (RFin). The amplified signal can then be output through the collector of the third transistor 133, and then through an output port (RFout). Thus, the third base of the third transistor 133 may be coupled to an RF input configured to receive an input RF signal and the third collector of the third transistor 133 may be coupled to an RF output configured to provide an output RF signal that is an amplified version of the input RF signal.

The voltage adjustment (VA) component 116 may reduce the voltage from the input of the VA component 116 (coupled to the first emitter of the first transistor 131) to the output of the VA component 116 (coupled to the output 142 of the bias circuit 314). Unlike a resistor, which reduces a voltage in an amount proportional to a magnitude of a current through resistor, the VA component 116 may reduce the voltage from the input of the VA component 116 to the output of the VA component 116 substantially independent of a magnitude of a current through the VA component 116 (e.g., from the VA input to the VA output). The VA component 116 may include, for example, one or more diodes connected in series between the VA input and the VA output. Other examples are described in detail below with respect to FIGS. 4A-4D.

Without a VA component, the collector-emitter voltage (Vce) of the second transistor 132 may be substantially different from the Vce of the third transistor 133. Thus, in operation (particular at peak power levels), the power dissipation of the second transistor 132 may be substantially different (e.g., less) than the power dissipation of the third transistor 133. Consequently, the second transistor 132 may generate more heat and be at different temperature than the third transistor 133. Thus, the second transistor 132 may not properly track the third transistor 133 and the output current may not accurately reflect the input current.

In some implementations, the VA component 116 equalizes the voltage such that the collector-emitter voltage between the second collector and the second emitter of the second transistor 132 is approximately equal to the collector-emitter voltage between the third collector and the third emitter of the third transistor 133. Further, in some implementations, the VA component 116 lowers the collector-emitter voltage of the first transistor 131, thereby potentially reducing DC voltage droop of the first transistor 131 under high power RF input to the power amplifier 302.

For example, in a system in which the supply voltage is 5.0 V and the base-emitter voltage drop across each transistor is 0.7 V, the Vce of the third transistor 133 may be approximately 5.0 V, presuming that the third impedance 153 (e.g., an inductor) does not have a significant effect on the voltage.

Without a voltage adjustment component 116, the Vce of the second transistor 132 may be approximately 1.4 V. In particular, the voltage at the output 142 may be approximately 0.7 V due to the base-emitter voltage drop of the third transistor 132 and the voltage at the collector of the second transistor 132 may be approximately 0.7 V more than that due to the base-emitter voltage drop of the first transistor 131. Because the emitter of the second transistor 132 is coupled to the ground voltage (e.g., 0 V), the collector-emitter voltage of the second transistor may be approximately 1.4 V. Further presuming that the first impedance 151 (e.g., a resistor with minimal current flowing through it or with a low resistance) does not have a significant effect on the voltage, the Vce of the first transistor 131 is approximately 4.3 V (e.g., the supply voltage less the base-emitter voltage drop of the third transistor 133). The power dissipation of the first transistor 131 may be approximately a collector-emitter current (Ice) multiplied by the collector-emitter voltage (Vce).

Figure 4A:
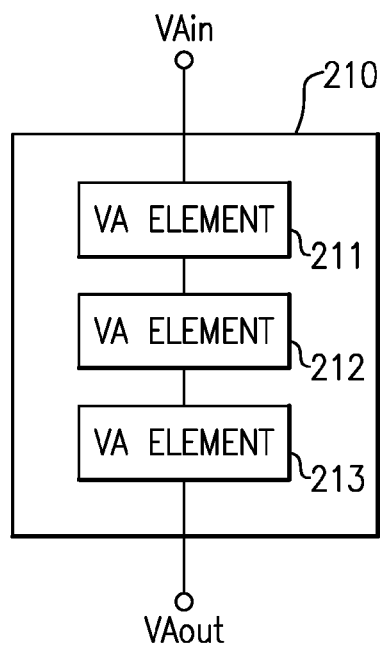
FIG. 4A shows a voltage adjustment component including a plurality of voltage adjustment elements connected in series.
Figure 4B:
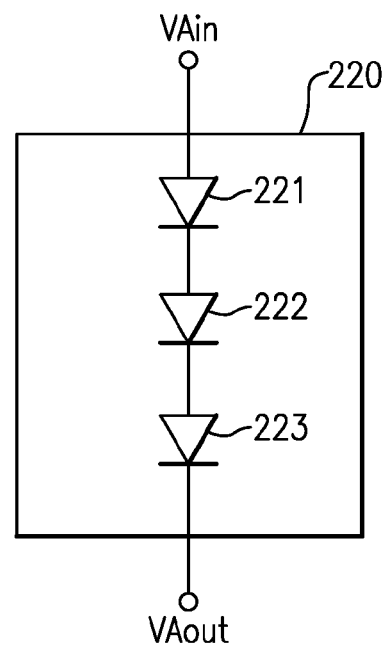
FIG. 4B shows a voltage adjustment component including a plurality of diodes connected in series.

However, with a voltage adjustment component 116 that adjusts the voltage by 3.5 V (e.g., a string of five transistors having their respective bases and collectors coupled and connected in series as shown in FIG. 4B), the Vce of the second transistor 132 may be approximately 4.9 V. In particular, the voltage at the output 142 (and the output of the VA component 116) may be 0.7 V due to the base-emitter drop of the third transistor 133. The voltage at the input of the VA component may be 3.5 V more, e.g., 4.2 V. Finally, the voltage at the collector of the second transistor 132 may be approximately 0.7 V more than that (e.g., 4.9 V) due to the base-emitter voltage drop of the first transistor 131. Because the emitter of the second transistor 132 is coupled to the ground voltage (e.g., 0 V), the collector-emitter voltage of the second transistor may be approximately 4.9 V. Thus, the Vce of the second transistor 132 is approximately equal to the Vce of the third transistor 133, potentially improving temperature tracking and linear performance.

Further, with such a VA component 116, the Vce of the first transistor 131 is approximately 0.8 V (e.g., the supply voltage less the base-emitter voltage drop of the third transistor 133 and the voltage adjustment of the VA component 116) rather than 4.3 V without the VA component 116 as described above. Thus, the power dissipation is similarly reduced, from 4.3 times the collector-emitter current to 0.8 times the collector-emitter current. The reduction in power dissipation of the first transistor 131 may result in a more robust current delivery at high power RF input or elevated temperatures, thereby potentially reducing the DC droop of the voltage at the output 142 of the bias circuit 314.

Although example values are described for the supply voltage and the base-emitter voltage drop across each transistor, it is to be appreciated that these values may be any value. For example, the supply voltage may be approximately 2.5 V. The base-emitter voltage drop across at least one of the transistors may be between 0.5 V and 0.7 V for a silicon transistor or between 0.1 V and 0.3 V for a germanium transistor.

FIGS. 4A-4D show example voltage adjustment components having various elements connected between the VA input (VAin) and the VA output (VAout) to reduce the voltage from the VA input to the VA output.

FIG. 4A shows a voltage adjustment component 210 including a plurality of voltage adjustment elements 211-213 connected in series. The voltage adjustment elements may include any of the elements described below, such as a diode, a transistor, a Darlington configuration, or a combination of different elements. Although three voltage adjustment elements 211-213 are shown in FIG. 4A, it is to be appreciated that the VA component 210 may include any number of VA elements, including one, two, three, four, five, or more VA elements.

FIG. 4B shows a voltage adjustment component 220 including a plurality of diodes 221-223 connected in series. The diodes 221-223 may include at least one silicon diode having a voltage drop between approximately 0.6 V and 0.7 V. The diodes 221-223 may include at least one germanium diode having a voltage drop between approximately 0.1 V and 0.3 V. The diodes 221-223 may include at least one Schottky diode having a voltage drop between approximately 0.15 V and 0.45 V. The diodes 221-223 may be of the same type or different types and the number and/or type of diodes may be selected to provide a voltage adjustment of a particular value such that the Vce of the mirror device (e.g., the second transistor 132 of FIG. 3) is approximately equal to the Vce of the RF device (e.g., the third transistor 133 of FIG. 3) or such that the power dissipation of the mirror device is approximately equal to the power dissipation of the RF device.

Figure 4C:
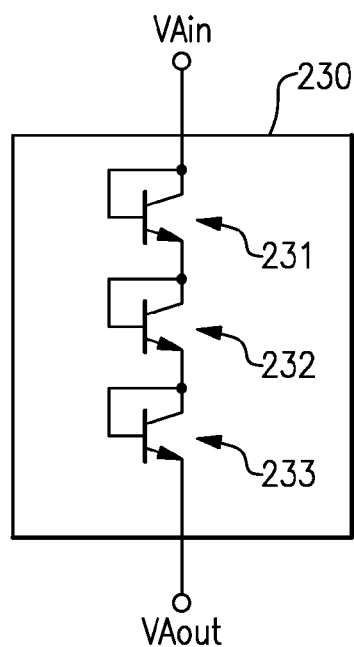
FIG. 4C shows a voltage adjustment component including a plurality of transistors connected in series.

FIG. 4C shows a voltage adjustment component 230 including a plurality of transistors 231-233 connected in series. Each of the transistors 231-233 may have its base coupled to its collector and may, therefore, act as a diode. The collector (and base) of the next transistor in the series may be coupled to the emitter of the previous transistor in the series. The transistors 231-233 may include at least one silicon transistor having a base-emitter voltage drop between approximately 0.6 V and 0.7 V. The transistors 231-233 may include at least one germanium transistor having a base-emitter voltage drop between approximately 0.1 V and 0.3 V.

Figure 4D:
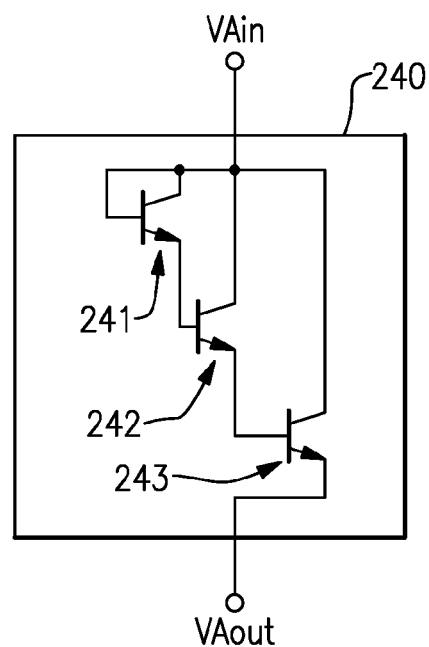
FIG. 4D shows a voltage adjustment component include a plurality of transistors connected in a Darlington arrangement.

FIG. 4D shows a voltage adjustment component 240 including a plurality of transistors 241-243 connected in a Darlington arrangement. Each of the transistors 241-243 may have a collector coupled to the VA input. The base of the first transistor 241 may also be coupled to the VA input. The emitter of the last transistor 243 may be coupled to the VA output. The base of the next transistor in the configuration may be coupled to the emitter of the previous transistor in the configuration. For example, the base of the second transistor 242 may be coupled to the emitter of the first transistor 241 and the emitter of the second transistor 242 may be coupled to the base of the third transistor 243. Although three transistors 241-243 are shown, it is to be appreciated that the Darlington configuration may include two, three, four, five, or more transistors.

Figure 5:
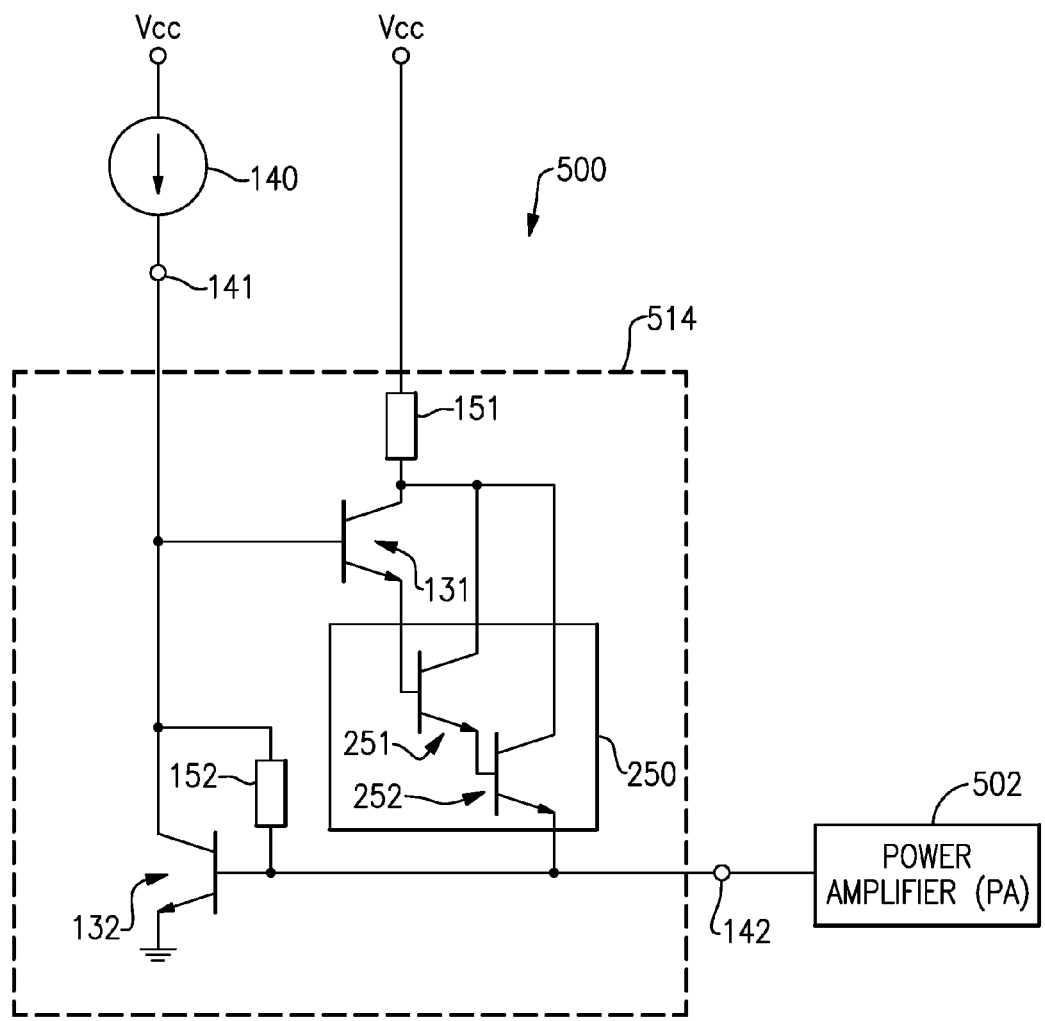
FIG. 5 shows an amplification system including a first transistor in a Darlington configuration with transistors of a voltage adjustment component.

FIG. 5 shows an amplification system 500 including a first transistor 131 in a Darlington configuration with transistors 251-252 of a voltage adjustment component 250. The amplification system 500 includes a bias circuit 514 and a power amplifier 502. The bias circuit 514 can provide a bias signal to the power amplifier 502, which may correspond, for example, to the power amplifier 302 of FIG. 3.

The bias circuit 514 may be substantially similar to the bias circuit 314 of FIG. 3, but include a voltage adjustment component 250 that is coupled to both the emitter of the first transistor 131 (as in the bias circuit 314 of FIG. 3) and to the collector of the first transistor 131. The bias circuit 514 includes an input 141 that receives an input current and an output 142 that provides an output current. The output current may reflect the input current, being equal to the input current or proportional to it, substantially independent of the load of the power amplifier 502. The input current may be generated by a current source 140 powered by a supply voltage (Vcc).

The bias circuit 514 includes a first transistor 131. The first transistor 131 may be configured as an emitter-follower device. The first transistor 131 has a first base that is coupled to the input 141 of the bias circuit 514, a first collector that is coupled (via a first impedance 151 that may include, for example, a resistor) to the supply voltage, and a first emitter that is coupled (via the voltage adjustment component 250) to the output 142 of the bias circuit 514.

The bias circuit 514 further includes a second transistor 132. The second transistor 132 may be configured as a mirror device. The second transistor 132 has a second base that is coupled to the output 142 of the bias circuit 514, a second collector that is coupled to the input 141 of the bias circuit 514, and a second emitter that is coupled to a ground voltage. The second base and the second collector of the second transistor 132 may be coupled by a second impedance 152 that may include, for example, a capacitor. Thus, the second base of the second transistor 132 may be coupled, via the second impedance 152, to the input 141 of the bias circuit 514.

The voltage adjustment (VA) component 250 may reduce the voltage from the input of the VA component (coupled to the first emitter of the first transistor 131) to the output of the VA component (coupled to the output 142 of the bias circuit 514). The VA component 250 may include two or more transistors connected in a Darlington configuration with the first transistor 131. In particular, the VA component includes a first VA transistor 251 having a base coupled to the emitter of the first transistor 131, a collector coupled to the collector of the first transistor 131, and an emitter coupled to the base of a second VA transistor 252. The second VA transistor 252 has a base coupled to the emitter of the first VA transistor 251, a collector coupled to the collector of the first transistor 131, and an emitter coupled to the output of the VA component 250. Although the Darlington configuration is shown in FIG. 5 as including three transistors (e.g., the first transistor 131 and two VA transistors 251-252), the Darlington configuration may include any number of transistors. For example, the Darlington configuration may include two transistors (e.g., the first transistor 131 and one VA transistor) or six transistors (e.g., the first transistor 131 and five VA transistors).

Figure 6:
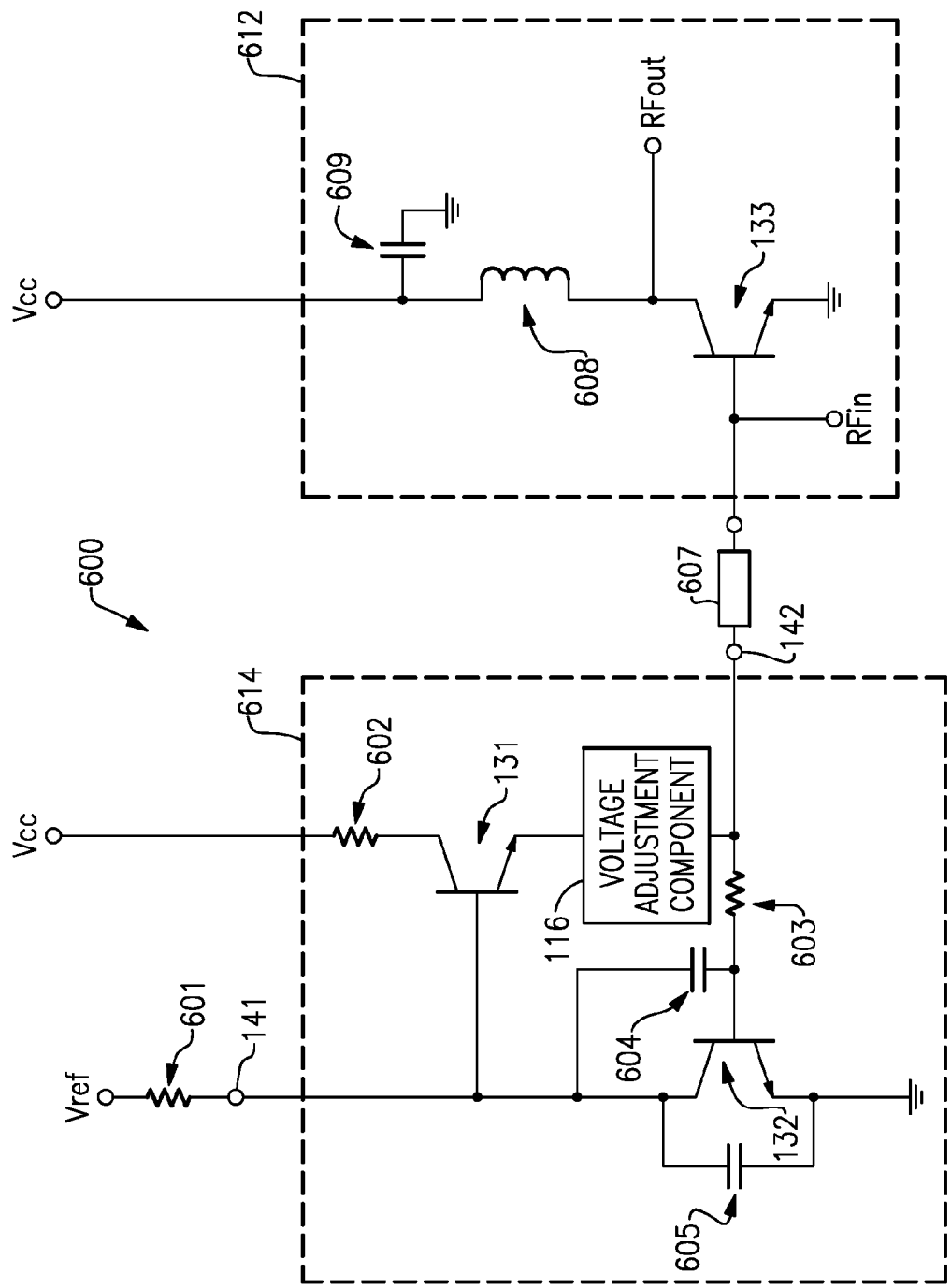
FIG. 6 shows an amplification system including an impedance coupled between a bias circuit and a power amplifier.

FIG. 6 shows an amplification system 600 including an impedance 607 coupled between a bias circuit 614 and a power amplifier 612. The bias circuit 614 can provide a bias signal to the power amplifier 612. In some embodiments, the power amplifier 612 can be one of a plurality of amplification stages of the amplification system, including but not limited to a driver stage or an output stage.

The bias circuit 614 may be configured as a current mirror bias circuit. The bias circuit 614 includes an input 141 that receives an input current (or an input voltage) and an output 142 that provides an output current (or an output voltage). The output may reflect the input, being equal to the input or proportional to it, substantially independent of the load of the power amplifier 612. The input may be generated by a reference voltage (Vref) applied to a resistor 601. The reference voltage may be between approximately 0.7 V and 1.4 V. The output may bias a transistor 133 of the power amplifier 612.

The bias circuit 614 includes a first transistor 131. The first transistor 131 may be configured as an emitter-follower device. The first transistor 131 has a first base that is coupled to the input 141 of the bias circuit 614, a first collector that is coupled (via a resistor 602) to the supply voltage (Vcc), and a first emitter that is coupled (via a voltage adjustment component 116) to the output 142 of the bias circuit 614.

The bias circuit 614 further includes a second transistor 132. The second transistor 132 may be configured as a mirror device. The second transistor 132 has a second base that is coupled (via a resistor 603) to the output 142 of the bias circuit 614, a second collector that is coupled to the input 141 of the bias circuit 614, and a second emitter that is coupled to a ground voltage. The second base and the second collector of the second transistor 132 may be coupled by a capacitor 604. Thus, the second base of the second transistor 132 may be coupled, via the capacitor 604, to the input 141 of the bias circuit 614. Similarly, the second emitter and the second collector of the second transistor 132 may be coupled by a capacitor 605.

The bias circuit 614 is coupled to the power amplifier 612 via an impedance 607. The impedance 607 (and any of the impedances described above) may include one or more resistors, capacitors, inductors, or other passive components coupled in series and/or parallel. In one embodiment, the impedance 607 includes a resistor. In another embodiment, the impedance 607 includes an inductor. Further, although particular couplings are described in FIG. 6 (and above) as including impedances, it is to be appreciated that the impedances may be absent or that couplings described (and/or shown) without an impedance may include an impedance either expressly or implicitly.

The power amplifier 612 includes a third transistor 133. The third transistor 133 may be configured as an RF device. The third transistor 133 has a third base that is coupled (via the impedance 607) to the output 142 of the bias circuit 614, a third collector that is coupled (via an inductor 608) to the supply voltage, and a third emitter that is coupled to the ground voltage. As described above, a radio-frequency (RF) signal being amplified can be provided to the base of the third transistor 133 from an input port (RFin). The amplified signal can then be output through the collector of the third transistor 133, and then through an output port (RFout). Thus, the third base of the third transistor 133 may be coupled to an RF input configured to receive an input RF signal and the third collector of the third transistor 133 may be coupled to an RF output configured to provide an output RF signal that is an amplified version of the input RF signal.

The power amplifier 612 includes a capacitor 609 having a first terminal coupled to the supply voltage and a second terminal coupled to the ground voltage.

As described above, the voltage adjustment (VA) component 116 may reduce the voltage from the input of the VA component (coupled to the first emitter of the first transistor 131) to the output of the VA component (coupled to the output 142 of the bias circuit 614). The VA component 116 may include any of the voltage adjustment components described above.

Figure 7:
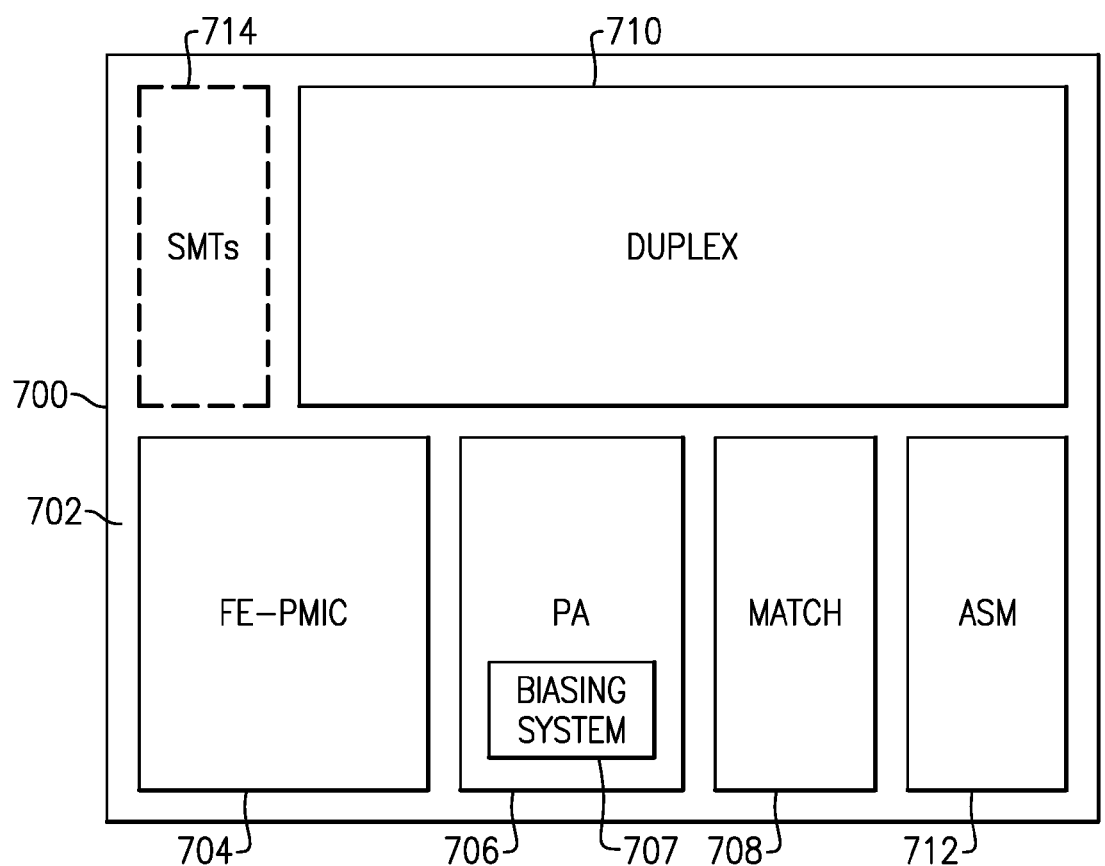
FIG. 7 depicts a module having one or more features as described herein.

FIG. 7 shows that in some embodiments, some or all of power amplification systems (e.g., those shown in FIGS. 3, 5, and 6) can be implemented, wholly or partially, in a module. Such a module can be, for example, a front-end module (FEM). In the example of FIG. 7, a module 700 can include a packaging substrate 702, and a number of components can be mounted on such a packaging substrate 702. For example, an FE-PMIC (Front End Power Management Integrated Circuit) component 704, a power amplifier assembly 706, a match component 708, and a duplexer assembly 710 can be mounted and/or implemented on and/or within the packaging substrate 702. The power amplifier assembly 706 may include a biasing system 707 that may a bias circuit such as those described above with respect to FIGS. 3, 5, and 6 and that may include a voltage adjustment component. Other components such as a number of SMT (surface-mount technology) devices 714 and an antenna switch module (ASM) 712 can also be mounted on the packaging substrate 702. Although all of the various components are depicted as being laid out on the packaging substrate 702, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
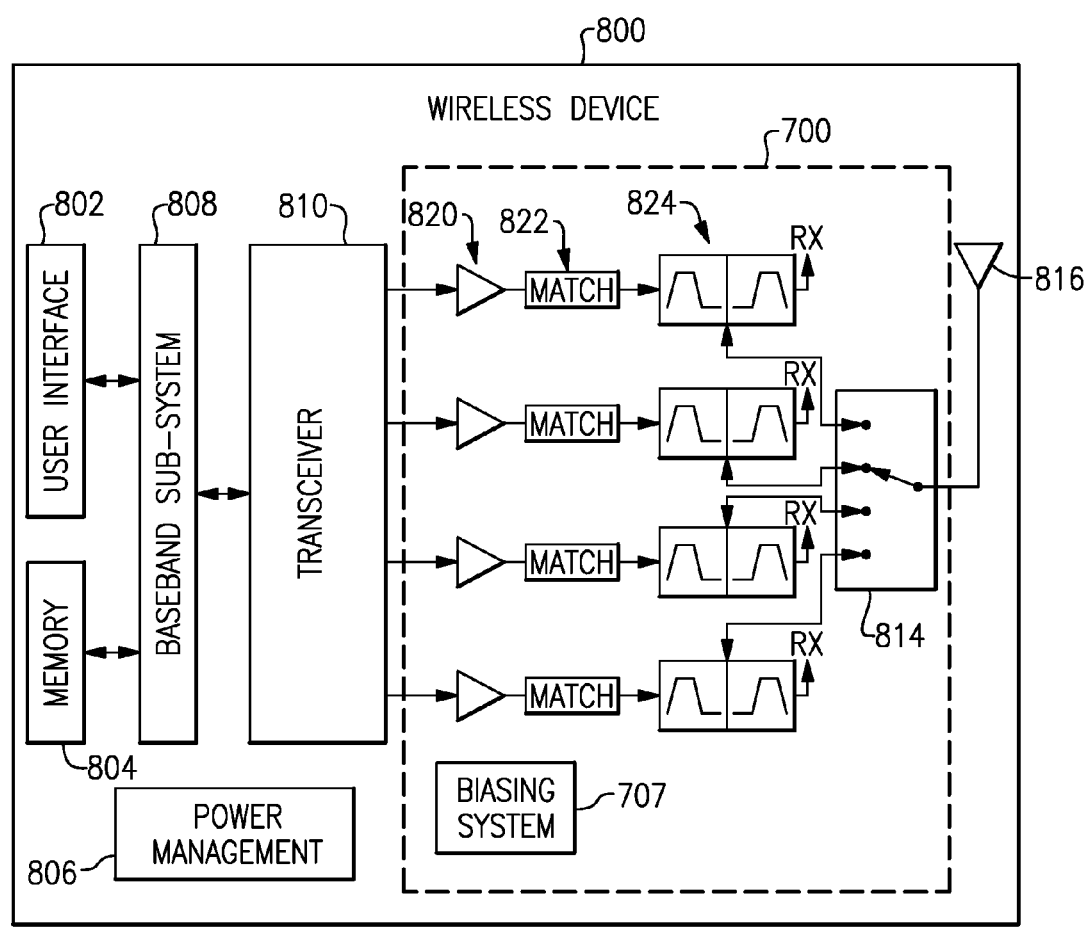
FIG. 8 depicts a wireless device having one or more features described herein.

FIG. 8 depicts an example wireless device 800 having one or more advantageous features described herein. In the context of a module having one or more features as described herein, such a module can be generally depicted by a dashed box 700, and can be implemented as, for example, a front-end module (FEM).

Referring to FIG. 8, power amplifiers (PAs) 820 can receive their respective RF signals from a transceiver 810 that can be configured and operated in known manners to generate RF signals to be amplified and transmitted, and to process received signals. The transceiver 810 is shown to interact with a baseband sub-system 808 that is configured to provide conversion between data and/or voice signals suitable for a user and RF signals suitable for the transceiver 810. The transceiver 810 can also be in communication with a power management component 806 that is configured to manage power for the operation of the wireless device 800. Such power management can also control operations of the baseband sub-system 808 and the module 700.

The baseband sub-system 808 is shown to be connected to a user interface 802 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

In the example wireless device 800, outputs of the PAs 820 are shown to be matched (via respective match circuits 822) and routed to their respective duplexers 824. In some embodiments, the power amplifiers 820 may be biased by the biasing system 707 that, as noted above, may include a bias circuit such as those described above with respect to FIGS. 3, 5, and 6 and may include a voltage adjustment component. Such amplified and filtered signals can be routed to an antenna 816 through an antenna switch 814 for transmission. In some embodiments, the duplexers 824 can allow transmit and receive operations to be performed simultaneously using a common antenna (e.g., 816). In FIG. 8, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS (Global Positioning System).

As described herein, one or more features of the present disclosure can provide a number of advantages when implemented in systems such as those involving the wireless device of FIG. 8. For example, a voltage drop component may reduce the collector-emitter voltage across an emitter-follower device of a bias circuit and may increase the collector-emitter voltage across a mirror device of the bias circuit. The collector-emitter voltage across the mirror device may be increased to better match the collector-emitter voltage across an RF device (e.g., a power amplifier) and improve temperature tracking of the mirror device at least when the RF device is used in at quiescent or linear modes of operation.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A biasing system comprising:
an input configured to receive an input current;
an output configured to provide an output current;
a first transistor having a first base coupled to the input and a first collector coupled to a supply voltage;
a second transistor having a second base coupled to the output, a second collector coupled to the input, and a second emitter coupled to a ground voltage; and
a voltage adjustment component having a voltage adjustment input coupled to a first emitter of the first transistor and a voltage adjustment output coupled to the output, the voltage adjustment component being configured to reduce a voltage from the voltage adjustment input to the voltage adjustment output substantially independent of a magnitude of a current through the voltage adjustment component.

2. The biasing system of claim 1 wherein the second base is coupled, via a capacitor, to the input.

3. The biasing system of claim 1 further comprising a third transistor having a third base coupled to the output, a third emitter coupled to the ground voltage, and a third collector coupled, via an inductor, to the supply voltage.

4. The biasing system of claim 3 wherein the third base is coupled to a radio-frequency (RF) input configured to receive an input RF signal and the third collector is coupled to an RF output configured to provide an output RF signal, the output RF signal being an amplified version of the input RF signal.

5. The biasing system of claim 3 wherein the output current biases the third transistor.

6. The biasing system of claim 3 wherein the first transistor is an emitter follower device, the second transistor is a mirror device, and the third transistor is an RF device.

7. The biasing system of claim 1 wherein the voltage adjustment component includes a diode.

8. The biasing system of claim 1 wherein the voltage adjustment component includes a voltage adjustment transistor having a voltage adjustment transistor base coupled to a voltage adjustment transistor collector.

9. The biasing system of claim 1 wherein the voltage adjustment component includes a plurality of voltage adjustment transistors in a Darlington configuration.

10. The biasing system of claim 1 wherein the voltage adjustment component includes a plurality of voltage adjustment elements connected in series.

11. The biasing system of claim 1 wherein the voltage adjustment component reduces a first collector-emitter voltage between the first collector and the first emitter.

12. The biasing system of claim 1 wherein the voltage adjustment component increases a second collector-emitter voltage between the second collector and the second emitter.

13. The biasing system of claim 3 wherein the voltage adjustment component equalizes the voltage such that a second collector-emitter voltage between the second collector and the second emitter is approximately equal to a third collector-emitter voltage between the third collector and a third emitter.

14. A radio-frequency (RF) module comprising:
a packaging substrate configured to receive a plurality of components; and
a biasing system implemented on the packaging substrate, the biasing system having an input configured to receive an input current and an output configured to provide an output current, the biasing system including a first transistor having a first base coupled to the input and a first collector coupled to a supply voltage, a second transistor having a second base coupled to the output, a second collector coupled to the input, and a second emitter coupled to a ground voltage, and a voltage adjustment component having a voltage adjustment input coupled to a first emitter of the first transistor and a voltage adjustment output coupled to the output, the voltage adjustment component being configured to reduce a voltage from the voltage adjustment input to the voltage adjustment output substantially independent of a magnitude of a current through the voltage adjustment component.

15. The RF module of claim 14, wherein the RF module is a front-end module (FEM).

16. The RF module of claim 15 wherein the RF module includes an RF system including a third transistor having a third base coupled to the output, a third emitter coupled to the ground voltage, and a third collector coupled, via an inductor, to the supply voltage.

17. The RF module of claim 16 wherein the third base is coupled to a radio-frequency (RF) input configured to receive an input RF signal and the third collector is coupled to an RF output configured to provide an output RF signal, the output RF signal being an amplified version of the input RF signal.

18. A wireless device comprising:
a transceiver configured to generate a radio-frequency (RF) signal;
a front-end module (FEM) in communication with the transceiver, the FEM including a packaging substrate configured to receive a plurality of components, the FEM further including a biasing system implemented on the packaging substrate, the biasing system having an input configured to receive an input current and an output configured to provide an output current, the biasing system including a first transistor having a first base coupled to the input and a first collector coupled to a supply voltage, a second transistor having a second base coupled to the output, a second collector coupled to the input, and a second emitter coupled to a ground voltage, and a voltage adjustment component having a voltage adjustment input coupled to a first emitter of the first transistor and a voltage adjustment output coupled to the output, the voltage adjustment component being configured to reduce a voltage from the voltage adjustment input to the voltage adjustment output substantially independent of a magnitude of a current through the voltage adjustment component; and
an antenna in communication with the FEM, the antenna configured to transmit the RF signal.

19. The wireless device of claim 18 wherein the FEM further includes an RF system implemented on the packaging substrate, the RF system including a third transistor having a third base coupled to the output, a third emitter coupled to the ground voltage, and a third collector coupled, via an inductor, to the supply voltage.

20. The wireless device of claim 19 wherein the third base is coupled to a radio-frequency (RF) input configured to receive the RF signal and the third collector is coupled to an RF output configured to provide the RF signal to the antenna.

* * * * *